United States Patent
Hagberg et al.

(10) Patent No.: US 6,690,709 B2
(45) Date of Patent: Feb. 10, 2004

(54) DEVICE AND METHOD FOR REDUCTION OF SPONTANEOUS EMISSION FROM EXTERNAL CAVITY LASERS

(75) Inventors: Mats Hagberg, Västra Frölunda (SE); Tomas Berg, Göteborg (SE); Bengt Kleman, Göteborg (SE); Tomas Lock, Västra Frölunda (SE)

(73) Assignee: Radians Innova AB, Gotenburg (SE)

( * ) Notice: Subject to any disclaimer, the term of this patent is extended or adjusted under 35 U.S.C. 154(b) by 0 days.

(21) Appl. No.: 10/005,812

(22) Filed: Dec. 7, 2001

(65) Prior Publication Data
US 2002/0090017 A1 Jul. 11, 2002

Related U.S. Application Data
(60) Provisional application No. 60/251,509, filed on Dec. 7, 2000.

(30) Foreign Application Priority Data
Dec. 7, 2000 (SE) .............................................. 0004530

(51) Int. Cl.[7] .................................................. H01S 3/10
(52) U.S. Cl. ........................... 372/108; 372/20; 372/99
(58) Field of Search ............................. 772/20, 99, 102, 772/108

(56) References Cited

U.S. PATENT DOCUMENTS

| 4,299,490 A | * 11/1981 | Cahill et al. ................. 356/464 |
| 4,963,003 A | * 10/1990 | Hiiro .......................... 359/495 |
| 5,406,571 A | 4/1995 | Bucher et al. |
| 5,477,309 A | * 12/1995 | Ota et al. ...................... 355/67 |
| 5,682,239 A | * 10/1997 | Matsumoto et al. ......... 356/488 |
| 5,696,782 A | * 12/1997 | Harter et al. ................. 372/25 |
| 5,892,597 A | * 4/1999 | Iwata et al. .................... 359/11 |
| 6,091,755 A | * 7/2000 | Sanders et al. ................ 372/92 |

OTHER PUBLICATIONS

Electronics Letters, vol. 33, No. 16, pp. 1387–1389.

* cited by examiner

Primary Examiner—Paul Ip
Assistant Examiner—Dung Nguyen
(74) Attorney, Agent, or Firm—Birch, Stewart, Kolasch & Birch, LLP

(57) ABSTRACT

The present invention relates to a device for outcoupling of light in an external cavity laser, which external cavity laser comprises at least one light source, at least one wavelength selective feedback element, at least one polarization selective beam-splitting optical element, and at least one Faraday-rotator element.

16 Claims, 5 Drawing Sheets

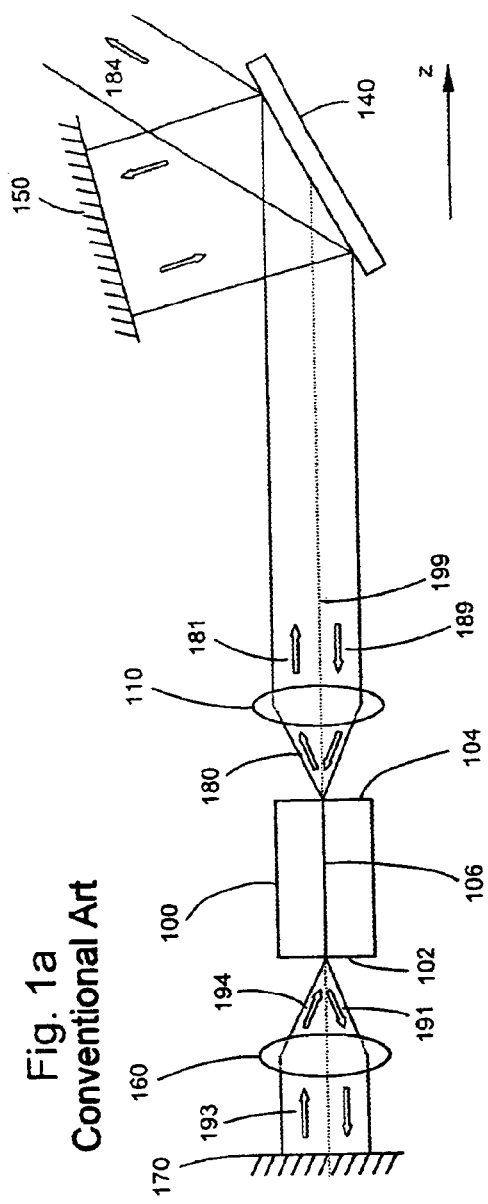
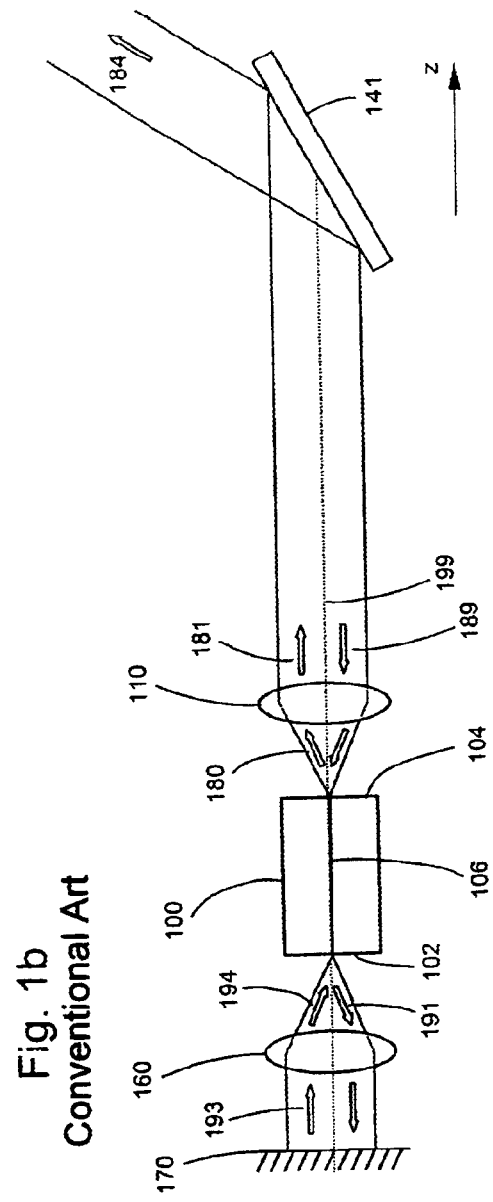
Fig. 1a
Conventional Art
Fig. 1b
Conventional Art

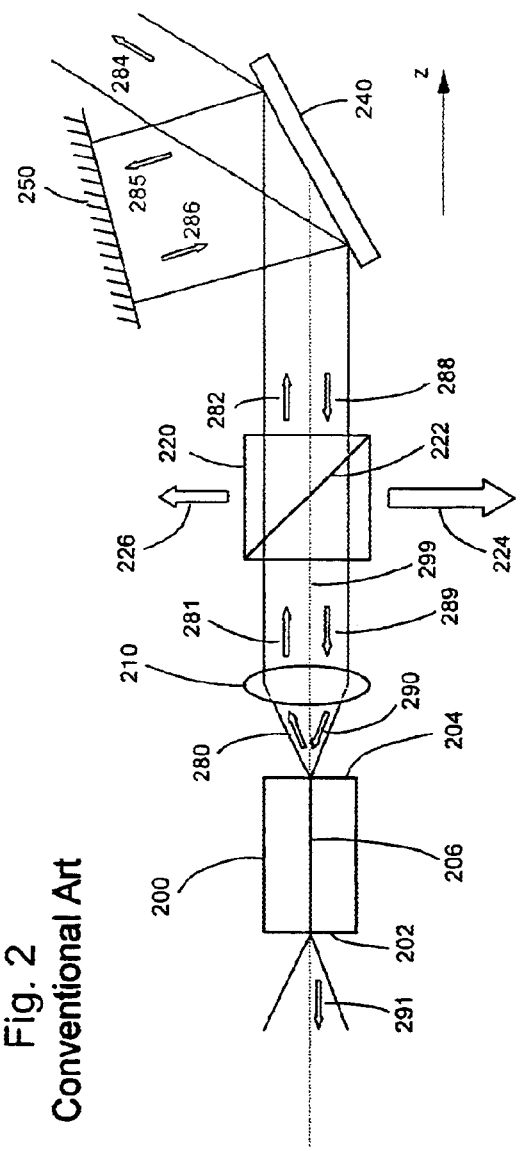

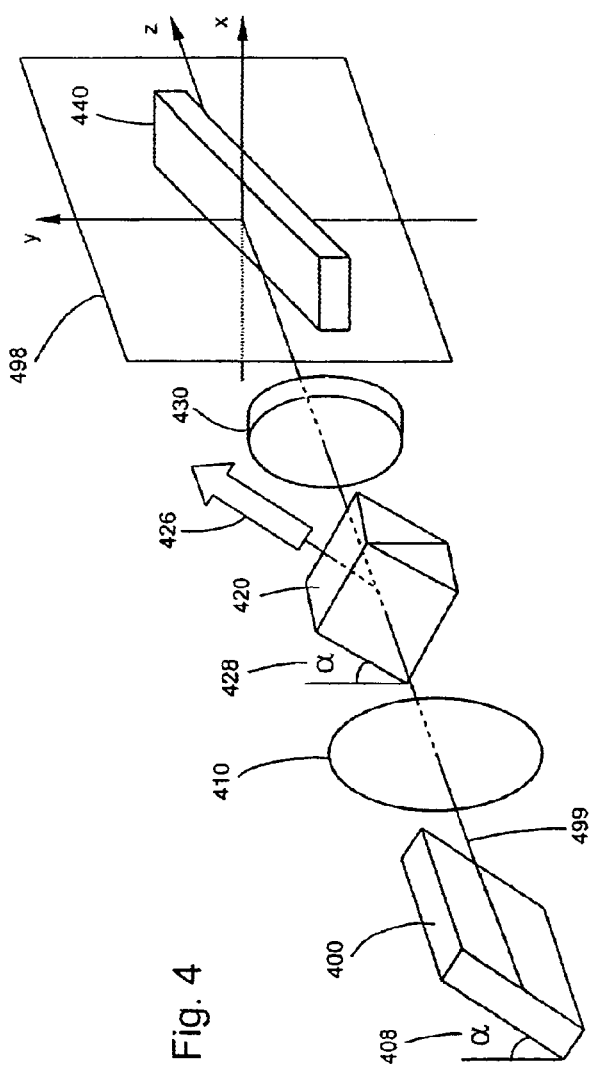
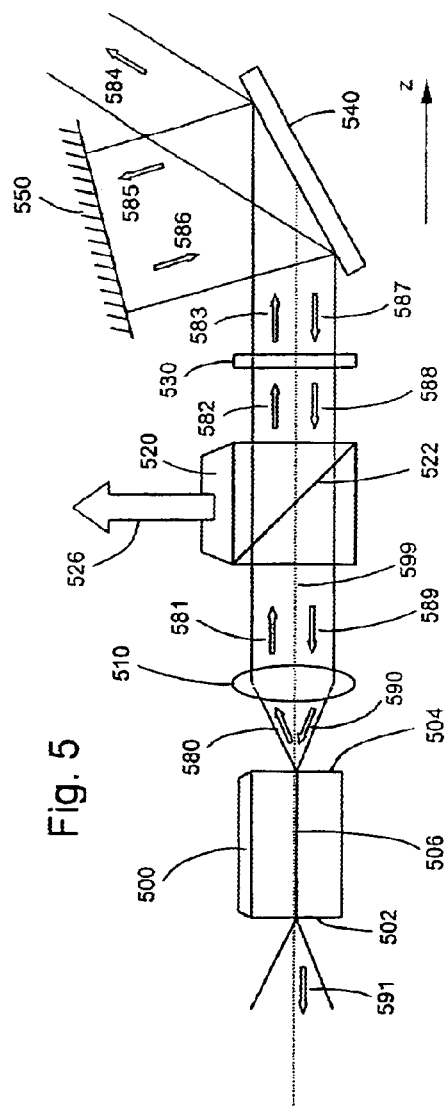

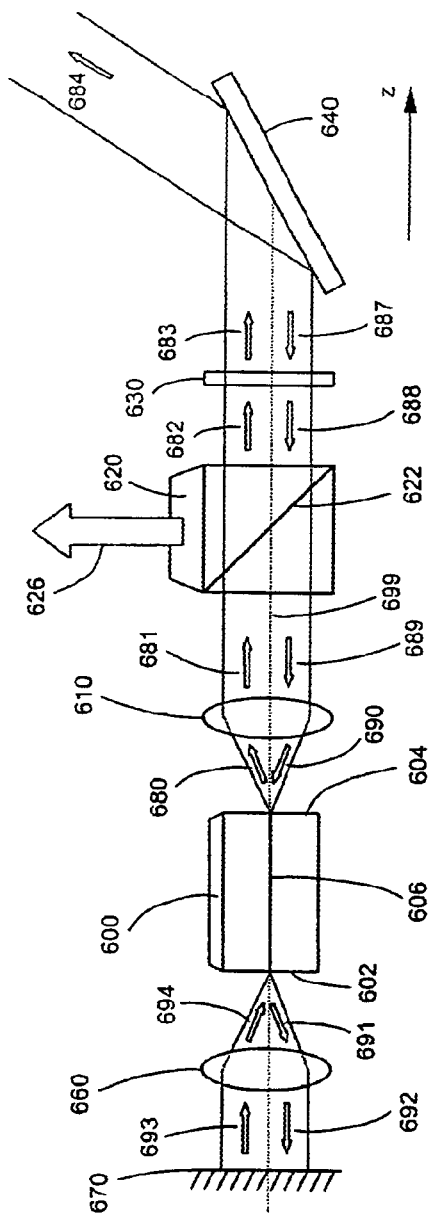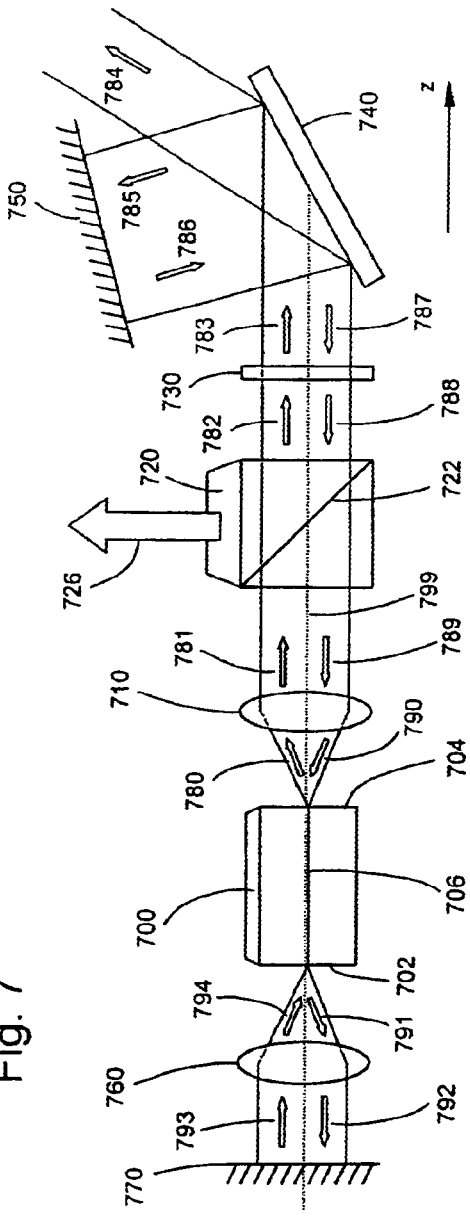

DEVICE AND METHOD FOR REDUCTION OF SPONTANEOUS EMISSION FROM EXTERNAL CAVITY LASERS

This application claims priority on provisional Application No. 60/251,509 filed on Dec. 7, 2000, the entire contents of which are hereby incorporated by reference.

BACKGROUND OF THE INVENTION

1. Field of the Invention

The present invention relates to a device and a method for efficient outcoupling of optical power in an external cavity laser, such that the outcoupled light contains a reduced fraction of spontaneous emission compared with traditional devices and methods.

2. Background Information

An external cavity laser is a type of laser, which is often used when it is desirable to be able to vary the wavelength of the light emitted from the laser. An example of an external cavity laser is shown in FIG. 1a. It comprises a light emitting and/or amplifying element 100, for example a semiconductor laser die, a first reflecting external element 170 and a second reflecting external element 150. The term "cavity" refers to an optical resonator cavity, which is the space between the end reflecting elements 150, 170 in a laser. The term "external" refers to that the cavity is longer than the light emitting and/or amplifying element 100. The first reflecting external element 170 can be replaced with the facet 102 of the light emitting and/or amplifying element 100, if said facet 102 is at least partly reflecting. The second reflecting element is often arranged in combination with a wavelength selective element, for example a diffraction grating 140. Such configuration with a reflecting element 150 and a diffraction grating 140 is often referred to as a Littman cavity. In the Littman cavity, the laser wavelength can be varied by changing the angle of the reflecting element 150 relative the diffraction grating 140. FIG. 1b shows a cavity configuration where the diffraction grating 141 itself is the second reflecting element. Such configuration is often referred to as a Littrow cavity. In the Littrow cavity, the laser wavelength can be varied by changing the angle of the grating relative the optical axis 199 in the cavity.

If, but not only if, the light emitting and/or amplifying element 100 is a semiconductor laser die, said light emitting and/or amplifying element includes an optical waveguide 106. The optical waveguide 106 is narrower than the optical beam 181 and at least one converging optical element 110 is used for collimating the diverging beam 180 and focusing the collimated beam 189. If a first reflecting external element 170 is used, at least one converging optical element 160 is used for collimating the diverging beam 191 and focusing the collimated beam 193.

All interfaces, except for the first and second reflecting elements, should be arranged such that said interfaces do not reflect the light in the direction of the cavity optical axis 199. Alternatively, said interfaces can be coated for anti-reflection. If, but not only if, the light emitting and/or amplifying element 100 is a semiconductor laser die, the facet 104, facing the direction of the second reflecting element, is often coated for anti-reflection.

The optical power can be coupled out of the cavity, to the output beam or optical fiber, in several ways. For example, if a diffraction grating is used in a Littman or Littrow configuration, the light not diffracted but reflected from the diffraction grating, can be used as output optical power 184. If the first reflecting element is a partly reflecting facet 102 of the light emitting and/or amplifying element 100, the power 191 transmitted through the facet 102 can be used as the external cavity laser output. These, but not limited to these, examples of outcoupling methods will be referred to as traditional outcoupling methods.

The coherent emission from the external cavity laser is typically spectrally very narrow. However, the light emitting and/or amplifying element 100 also generates a broad spectrum of spontaneous emission. For a traditional external cavity laser emitting a total of, for example, 1 mW optical power into a single mode fiber, approximately 10 $\mu$W of the power is spontaneous emission. This power ratio of 20 dB is insufficient for many applications, for example, when the laser is used for characterization of optical filters. A laser source emitting a smaller fraction of spontaneous emission would be very attractive.

A method and device for reducing the fraction of spontaneous emission in the optical output from external cavity lasers has been demonstrated by Edgar Leckel et al. [Ref. 1]. The demonstrated device was used in a Littman external cavity laser as shown in FIG. 2. A beam-splitter 220 was placed between the wavelength selective element 240, in this case a diffraction grating, and the light emitting and/or amplifying element 200, in this case a semiconductor laser die. The beam-splitter 220 deflects a fraction of the incident lights in two opposite directions 224 226 corresponding to the two directions of propagating light 281 288 inside the cavity. The outcoupled beam 224, originating from the light 281 propagating from the semiconductor laser die 200 towards the diffraction grating 240, contains the same fraction spontaneous emission as for traditional outcoupling. The outcoupled beam 226, originating from the light 288 propagating from the diffraction grating 240 towards the semiconductor laser die 200, is spectrally filtered, such that the spontaneous emission has an angular distribution around the direction of propagation for the lasing wavelength. If the spectrally filtered outcoupled beam 226 is also spatially filtered, for example using a single mode optical fiber, the fraction of spontaneous emission of said beam is typically reduced by a factor of 1000. The main disadvantage with this method is that a large amount of the total outcoupled optical power is not spectrally filtered.

The optical power in the spectrally filtered beam 226 can be no more than equal to the optical power in the beam 224 that is not spectrally filtered. Therefore, no more than ½ of the optical power outcoupled by the beam-splitter can be used as a low spontaneous emission light source.

In U.S. Pat. No. 5,406,571 is a tunable laser oscillator is disclosed, which comprises a laser medium, an optical resonator, a wavelength selective element for adjusting the wavelength of a laser beam, and optical means for broadening the radiation in the resonator. The laser beam is decoupled from the resonator by means of an optical element after having passed the broadening means and prior to passing again through the laser medium. The laser beam is decoupled from the resonator such that its direction is independent of the beam wavelength.

The laser beam generated in an optical amplifying medium is divided into two beams by means of a prism. One of the beams comprises a reflection from the prism's first surface. No reduction of the spontaneous emission is obtained in this beam. The other beam consists of diffracted beam inside the prism. Thus, the beam is broadened and illuminates a larger area of the wavelength-detecting element. The beam is diffracted so that it propagates in same beam path but in opposed direction. The light is finally decoupled out of the laser cavity by means of the first prism. The first prism is realized in two geometries and a number of cavity configurations. However, the object of laser according to this document is:

- to achieve high spectral purity, i.e. low spontaneous emission, for one of the beams decoupled from the cavity,
- that high spectral purity at one of the decoupled beams is achieved without any major structural changes in the structural changes in the laser cavity,
- that the direction of the decoupled spectrally pure beam is independent of the wavelength as well as the position of the wavelength selective element.

Moreover, this document does not mention or gives any hint of using a Faraday rotator.

However, a retardation plate is mentioned, which is a completely different element.

SUMMARY OF THE INVENTION

The present invention can couple part of a light beam propagating from a wavelength selective element, towards a light emitting and/or amplifying element, out of an optical cavity, without any outcoupling of the beam propagating from the light emitting and amplifying element towards the diffraction grating.

The present invention can solve problems of the prior art by arranging the initially mentioned elements and adding polarization selectivity to the beam-splitting optical element, and the introduction of a Faraday-rotator element. A polarization selective beam-splitting optical element is an element that essentially fully transmits, without deflection, incident light of one polarization and essentially fully deflects the light of the orthogonal polarization.

The external cavity laser and outcoupling device elements can be arranged such that linearly polarized light is essentially fully transmitted through the polarization selective beam-splitting optical element when propagating in a first direction, and is incident on the wavelength selective feedback element with a polarization such that said selective feedback element has essentially optimum efficiency, and is at least partly outcoupled from the cavity by the polarization selective beam-splitting optical element when propagating in a second direction. The light emitting and/or amplifying element is a semiconductor laser die and includes a narrow waveguide. It is also possible to use light converging elements. The device may also comprise a first reflecting element. In one embodiment, the wavelength selective feedback element redirects the light towards a retroreflector. A light beam path from said at least one light emitting and/or amplifying element to said feedback element is substantially L-shaped.

The invention also relates to a method for outcoupling of light in an external cavity laser, which external cavity laser comprises at least one light emitting and/or amplifying element, at least one wavelength selective feedback element. Thus, the method can include the steps of utilizing at least one polarization selective beam-splitting optical element, and at least one Faraday-rotator element, arranging said external cavity laser and outcoupling elements such that linearly polarized light is essentially fully transmitted through the polarization selective beam-splitting optical element when propagating in a first direction, and is incident on the wavelength selective feedback element with a polarization such that said selective feedback element has essentially optimum efficiency, and is at least partly outcoupled from the cavity by the polarization selective beam-splitting optical element when propagating in a second direction.

The invention also relates to a method for outcoupling of light in an external cavity laser, which external cavity laser comprises at least one light emitting and/or amplifying element, at least one wavelength selective feedback element. The method can include the steps of generating light of essentially linear polarization in said light emitting and/or amplifying element and emitting said light in a diverging beam, collimating said diverging beam in a light converging optical element to an essentially linearly polarized light beam, essentially fully transmitting said essentially linearly polarized light beam through a polarization selective beam-splitting optical element in a first direction, rotating the plane of polarization of said light beam in an angle $\alpha+m180°$, wherein m is an integer 0,1, 2, 3, etc, redirecting said light beam with rotated plane of polarization, rotating the plane of polarization of said redirected light beam so that the angle of the light polarization becomes an angle $2\alpha$ from a preferred angle of transmission through said polarization selective beam-splitting optical element, partly transmitting and partly outcoupling said redirected light beam when propagating through said polarization selective beam-splitting optical element in a second direction. Moreover, the fraction of light transmitted and outcoupled in the polarization selective beam-splitting optical element, when propagating in the second direction, is essentially $\cos^2(2\alpha)$ and essentially $\sin^2(2\alpha)$, respectively. The method can include the further step of selecting an appropriate angle a for determining the fraction of light coupled out of the cavity.

SHORT DESCRIPTION OF THE DRAWINGS

In the following sections, the invention will be described in more detail with reference to the attached drawings, in which:

FIG. 1a shows the principle of a Littman external cavity semiconductor laser.

FIG. 1b shows the principle of a Littrow external cavity semiconductor laser.

Figure 8:
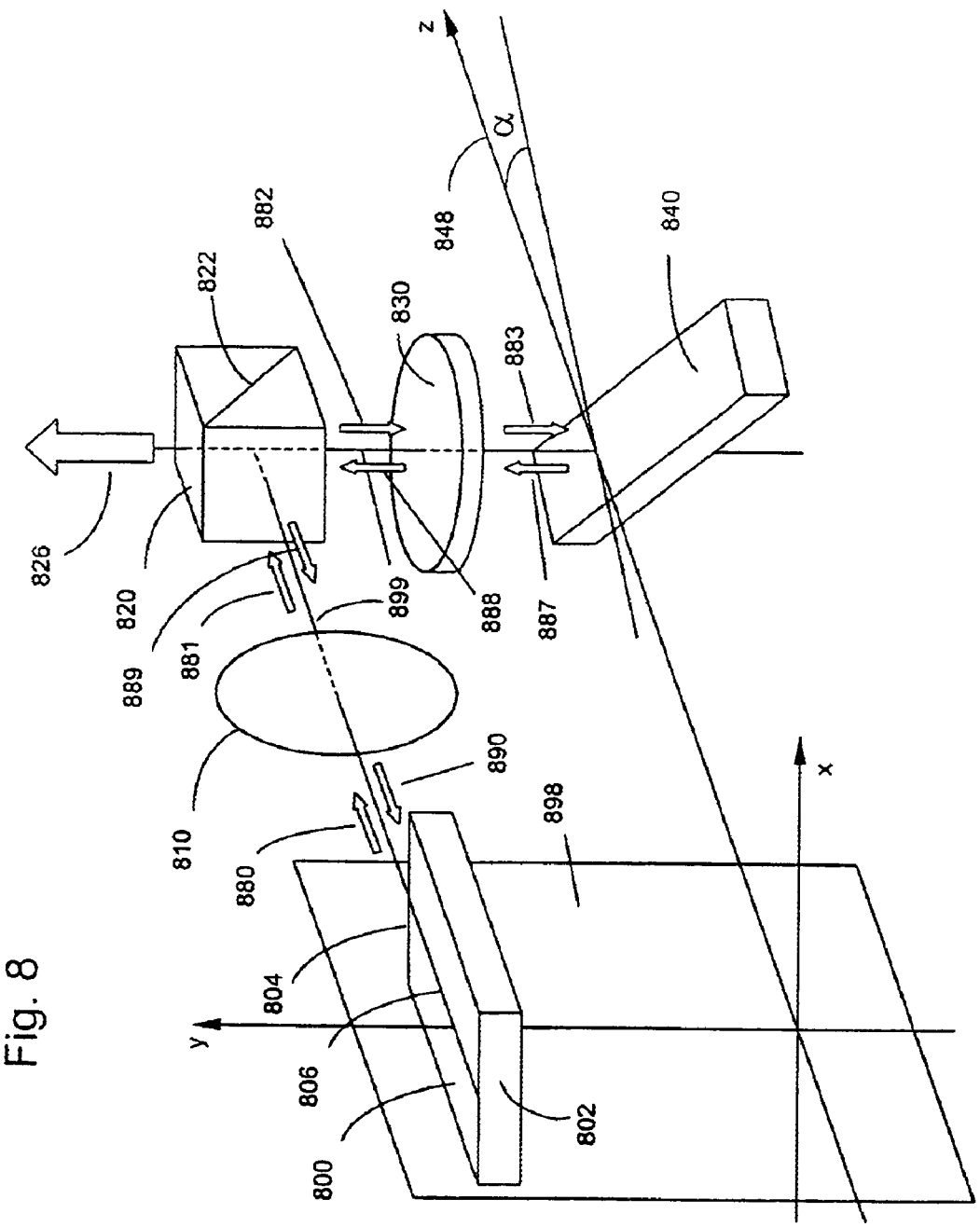

FIG. 2 shows a Littman external cavity semiconductor laser with a beam-splitter outcoupler for reduced spontaneous emission output, according to E, Leckel, J, Sang, E. U. Wagemann, and E. Muller, Paper WB4-1/31, Optical Fiber Conference, Baltimore Mass. mars 2000.

FIG. 3 shows, in a schematic way, a first embodiment of the present invention, comprising a Littrow external cavity semiconductor laser with a polarization selective beam-splitter outcoupler for reduced spontaneous emission, high efficiency output.

FIG. 4 shows schematically the same embodiment of the present invention as in FIG. 3, but from a view better describing the relative rotation of the optical elements.

FIG. 5 shows, in a schematic way, a second embodiment of the present invention, comprising a Littman external cavity semiconductor laser with a polarization selective beam-splitter outcoupler for reduced spontaneous emission, high efficiency output.

FIG. 6 shows, in a schematic way, a third embodiment of the present invention, comprising a Littrow external cavity semiconductor laser with a polarization selective beam-splitter outcoupler for reduced spontaneous emission, high efficiency output. The cavity has external feedback elements at both ends.

FIG. 7 shows, in a schematic way, a fourth embodiment of the present invention, comprising a Littman external cavity semiconductor laser with a polarization selective beam-splitter outcoupler for reduced spontaneous emission, high efficiency output. The cavity has external feedback elements at both ends.

FIG. 8 shows, in a schematic way, a fifth embodiment of the present invention, comprising a Littrow external cavity semiconductor laser with a polarization selective beam-splitter outcoupler for reduced spontaneous emission, high efficiency output. In this embodiment, the cavity is L-shaped and essentially all light is deflected by the polarization selective beam-splitter when propagating from the light emitting and/or amplifying element and partly deflected when propagating from the wavelength selective feedback element.

For the reference signs in FIG. 1 through FIG. 8, the first digit refers to the figure number and the second and third digits refer to an element, a part of an element, a light beam, an angle, or an axis.

DETAILED DESCRIPTION OF THE EMBODIMENTS

A first embodiment of the present invention is shown in FIG. 3. The components from the prior art are, but are not limited to, a light emitting and/or amplifying element 300, a light converging optical element 310, and a wavelength selective feedback element 340. The light emitting and/or amplifying element 300 can be a semiconductor laser die. The light converging optical element 310 can be a lens of refractive or diffractive type. The new elements are a polarization selective beam-splitting optical element 320 and a Faraday-rotator 330. The polarization selective beam-splitting optical element 320 can be a cube polarizer. If the light emitting and/or amplifying element 300 is a semiconductor laser die, it can have one or both end facets 302, 304, coated for low reflection or anti-reflection. In order to lower or remove the requirements for the anti-reflection coating, the waveguide 306 can be tilted from the facet normal, at one or both ends of the semiconductor laser die. This is described in Ref. 2 and Ref. 3, respectively. Also, in order to lower or remove the requirements for anti-reflection, the waveguide can end some distance from the facet normal, at one or both ends of the semiconductor laser die, as described in Ref. 4.

The typical wavelength selective feedback elements, and often also light emitting and/or amplifying elements, have polarization dependent efficiency. Therefore, external cavity lasers often emit light of linear polarization. In the present invention, the optical elements should be arranged along the cavity optical axis 499 relative each other, as shown in FIG. 4. For the optical elements, the polarization plane of the incident or emitted light, resulting in the highest efficiency for the desired function, will be referred to as the element preferred plane of polarization.

In FIG. 4, a plane of reference 498 is defined to be parallel with the preferred polarization plane of the diffraction grating 440 and the cavity optical axis 499. The light emitting and/or amplifying element 400 and the polarization selective beam-splitting optical element 420 should be oriented such that the angle between its preferred plane of polarization and the plane of reference 498 is essentially α and α, respectively. The light converging optical element 410 and the Faraday-rotator 430 are rotation symmetrical around the cavity optical axis 499.

In the first embodiment of the present invention shown in FIG. 3, the function is the following. Light of essentially linear polarization is generated in the light emitting and/or amplifying element 300 and emitted from the waveguide 306 in a diverging beam 380. In this example, the light emitting and/or amplifying element 300 is a semiconductor laser die with one essentially non-reflecting facet 304 and one at least partly reflecting facet 302. The diverging beam 380 is collimated by the light converging optical element 310. The essentially linearly polarized light in the collimated beam 381 is transmitted straight through the polarization selective beam-splitting optical element 320 with essentially no loss. The light 382 is then transmitted through the Faraday-rotator 330 where the plane of polarization is rotated essentially an angle α. The polarization of the light 383 is now essentially parallel with the plane of reference and is incident on the wavelength selective feedback element 340 essentially at its preferred polarization plane. In this example, the wavelength selective feedback element 340 is a diffraction grating. Due to the periodic nature of polarization rotation, a Faraday-rotator that rotates the polarization an angle α+m·180°, would lead to the same result for any integer, m.

The light 383 is redirected by the diffraction grating 340. When the light 387 is transmitted through the Faraday-rotator 330 it is rotated essentially an angle α. Due to the nature of the Faraday-rotator 330, the direction of polarization rotation is such that the angle of the light polarization is now essentially an angle 2α from the preferred angle of transmission through the polarization selective beam-splitting optical element 320. When the light 388 is propagating through the polarization selective beam-splitting optical element 320, the light is partially deflected 326 and coupled out of the cavity. The light 389 transmitted straight through the polarization selective beam-splitting optical element 320 is focused by the light converging optical element 310 and coupled into the waveguide 306 of the semiconductor laser die 300. The polarization of the light 390 has essentially the preferred direction for amplification in the semiconductor laser die 300. The light is amplified when propagating in the waveguide 306 and is, at least partly, reflected in the facet 302.

A selected fraction of the light 388, propagating from the diffraction grating 340 towards the semiconductor laser die 300, is coupled out of the cavity. Neglecting other losses, the fraction of light transmitted straight through 389 and out-coupled 326 in the polarization selective beam-splitting optical element 320 is essentially $\cos^2(2\alpha)$ and essentially $\sin^2(2\alpha)$, respectively. Thus, the fraction of light 326 coupled out of the cavity can be chosen by selecting an appropriate angle α. Eight values for α between 0 and 360° will result in the same fraction of light 326 coupled out of the cavity. Therefore, the angle α can also be selected such that the geometry of the elements is convenient for the mechanical design of the laser. If the optical components are aligned correctly, essentially no part of the light 381 propagating from the semiconductor laser die 300 towards the diffraction grating 340 is coupled out from the cavity.

In this section, the present invention is explained by means of five exemplary preferred embodiments, including a review of the first embodiment explained in FIG. 3 and FIG. 4.

FIG. 3 shows the principle of a Littrow external cavity semiconductor laser with a polarization selective beam-splitter outcoupler 320 for reduced spontaneous emission, high efficiency output 326, according to a first embodiment of the present invention. The semiconductor laser die 300 has one facet coated for anti-reflection 304 and one facet at least partly reflective 302. Light of essentially linear polarization is generated in the semiconductor laser die 300 and is emitted from the waveguide 306 in a diverging beam 380. The beam is collimated by the lens 310 and the collimated beam 381 is transmitted essentially without any fraction of the light being deflected in the polarization selective beam-splitter 320 by its oblique interface 322. The beam 382 is transmitted through a Faraday-rotator 330 within which the polarization of the light is rotated essentially an angle α. The transmitted beam 383 is redirected through diffraction by the grating 340 back towards the Faraday-rotator 330. The beam 387 is transmitted through the Faraday-rotator 330 within which the polarization of the light is rotated essentially an additional angle α. The beam 388 is partly transmitted straight through the polarization selective beam-splitter 320 and partly deflected in said beam-splitter 320 by its oblique interface 322. The deflected light 326, which is coupled out of the cavity, has reduced spontaneous emission. The beam transmitted straight through the polarization selective beam-splitter 389 is focused by the lens 310 and coupled back into the waveguide 306 of the semiconductor laser die 300. The light is amplified when propagating in the waveguide 306 and is, at least partly, reflected in the facet 302. In this embodiment of the present invention, essentially all of the light coupled out of the optical cavity by the polarization selective beam-splitter 320 is outcoupled in one direction 326 and has reduced spontaneous emission.

FIG. 4 shows the same embodiment of the invention as in FIG. 3, but from a view better describing the relative rotation of the optical elements. The plane of reference 498 is defined to be parallel with the preferred polarization plane of the diffraction grating 440 and the cavity optical axis 499. The Faraday-rotator 430 should rotate the polarization of light essentially an angle α when propagating through the element. The polarization selective beam-splitter 420 should be oriented such that light with polarization angle α, relative the plane of reference 498, is transmitted essentially without any fraction of the light being deflected by its oblique interface 422. The semiconductor laser die 400 should be oriented such that the angle between the polarization of the generated light and the plane of reference 498 is essentially α.

FIG. 5 shows the principle of a Littman external cavity semiconductor laser with a polarization selective beam-splitter outcoupler 520 for reduced spontaneous emission, high efficiency output 526, according to a second embodiment of the present invention. The semiconductor laser die 500 has one facet coated for anti-reflection 504 and one facet at least partly reflecting 502. Light of essentially linear polarization is generated in the semiconductor laser die 500 and is emitted from the waveguide 506 in a diverging beam 580. The beam is collimated by the lens 510 and the collimated beam 581 is transmitted essentially without any fraction of the light being deflected in the polarization selective beam-splitter 520 by its oblique interface 522. The beam 582 is transmitted through a Faraday-rotator 530 within which the polarization of the light is rotated essentially an angle α. The transmitted beam 583 is diffracted by the grating 540 towards the retro reflector 550. The beam 585 is reflected back towards the grating 540 by the retro reflector 550. The beam 585 is reflected back towards the grating 540. The beam 586 is diffracted by the grating 540 in the direction towards the Faraday-rotator 530. The beam 587 is transmitted through the Faraday-rotator 530 within which the polarization of the light is rotated essentially an additional angle α. The beam 588 is partly transmitted straight through the polarization selective beam-splitter 520 and partly deflected in said beam-splitter 520 by its oblique interface 522. The deflected light 526, which is coupled out of the cavity, has reduced spontaneous emission. The beam transmitted straight through the polarization selective beam-splitter 589 is focused by the lens 510 and coupled back into the waveguide 506 of the semiconductor laser die 500. The light is amplified when propagating in the waveguide 506 and is, at least partly, reflected in the facet 502. In this embodiment of the present invention, essentially all of the light coupled out of the optical cavity by the polarization selective beam-splitter 520 is outcoupled in one direction 526 and has reduced spontaneous emission.

FIG. 6 shows the principle of a Littrow external cavity semiconductor laser with a polarization selective beam-splitter outcoupler 620 for reduced spontaneous emission, high efficiency output 626, according to a third embodiment of the present invention. The cavity has external feedback elements at both ends. The semiconductor laser die 600 has both facets coated for anti-reflection 602, 604. Light of essentially linear polarization is generated in the semiconductor laser die 600 and is emitted from the waveguide 606 in a diverging beam 680. The beam is collimated by the lens 610 and the collimated beam 681 is transmitted essentially without any fraction of the light being deflected in the polarization selective beam-splitter 620 by its oblique interface 622. The beam 682 is transmitted through a Faraday-rotator 630 within which the polarization of the light is rotated essentially an angle α. The transmitted beam 683 is redirected through diffraction by the grating 640 back towards the Faraday-rotator 630. The beam 687 is transmitted through the Faraday-rotator 630 within which the polarization of the light is rotated essentially an additional angle α. The beam 688 is partly transmitted straight through the polarization selective beam-splitter 620 and partly deflected in said beam-splitter 620 by its oblique interface 622. The deflected light 626, which is coupled out of the cavity, has reduced spontaneous emission. The beam transmitted straight through the polarization selective beam-splitter 689 is focused by the lens 610 and coupled back into the waveguide 606 of the semiconductor laser die 600. The light is amplified as it propagates through the semiconductor laser die 600 and exits from the waveguide 606 as a diverging beam 691. The beam is collimated by the lens 660 and the collimated beam 692 is reflected by the external reflecting element 670. The reflected beam 693 is focused by the lens 660 and coupled back into the waveguide 606 of the semiconductor laser die 600. In this embodiment of the present invention, essentially all of the light coupled out of the optical cavity by the polarization selective beam-splitter 620 is outcoupled in one direction 626 and has reduced spontaneous emission.

FIG. 7 shows the principle of a Littman external cavity semiconductor laser with a polarization selective beam-splitter outcoupler 720 for reduced spontaneous emission, high efficiency output 726, according to a fourth embodiment of the present invention. The cavity has external feedback elements at both ends. The semiconductor laser die 700 has both facets coated for anti-reflection 702, 704. Light of essentially linear polarization is generated in the semiconductor laser die 700 and is emitted from the waveguide 706 in a diverging beam 780. The beam is collimated by the lens 710 and the collimated beam 781 is transmitted essentially without any fraction of the light being deflected in the polarization selective beam-splitter 720 by its oblique interface 722. The beam 782 is transmitted through a Faraday-rotator 730 within which the polarization of the light is rotated essentially an angle α. The transmitted beam 783 is diffracted by the grating 740 towards the retro reflector 750. The beam 785 is reflected back towards the grating 740 by the retro reflector 750. The beam 786 is diffracted by the grating 740 in the direction towards the Faraday-rotator 730. The beam 787 is transmitted through the Faraday-rotator 730 within which the polarization of the light is rotated essentially an additional angle α. The beam 788 is partly transmitted straight through the polarization selective beam-splitter 720 and partly deflected in said beam-splitter 720 by its oblique interface 722. The deflected light 726, which is coupled out of the cavity, has reduced spontaneous emission. The beam transmitted straight through the polarization selective beam-splitter 789 is focused by the lens 710 and coupled back into the waveguide 706 of the semiconductor laser die 700. The light is amplified as it propagates through the semiconductor laser die 700 and exits from the waveguide 706 as a diverging beam 791. The beam is collimated by the lens 760 and the collimated beam 792 is reflected by the external reflecting element 770. The reflected beam 793 is focused by the lens 760 and coupled back into the waveguide 706 of the semiconductor laser die 700. In this embodiment of the present invention, essentially all of the light coupled out of the optical cavity by the polarization selective beam-splitter 720 is outcoupled in one direction 726 and has reduced spontaneous emission FIG. 8 shows the principle of a L-shaped Littrow external cavity semiconductor laser with a polarization selective beam-splitter outcoupler 820 for reduced spontaneous emission, high efficiency output 826, according to a fifth embodiment of the present invention. The plane of reference 898 is defined to be parallel with the L-shaped cavity optical axis 899. The semiconductor laser die 800 has one facet coated for anti-reflection 804 and one facet at least partly reflective 802. Light of essentially linear polarization, perpendicular with the plane of reference, is generated in the semiconductor laser die 800 and is emitted from the waveguide 806 in a diverging beam 880. The beam is collimated by the lens 810 and essentially all of the collimated beam 881 is deflected in the polarization selective beam-splitter 820 by its oblique interface 822. The beam 882 is transmitted through a Faraday-rotator 830 within which the polarization of the light is rotated essentially an angle α. The transmitted beam 883 is incident on the diffraction grating, which is oriented such that the polarization of the incident light is parallel with the preferred polarization plane of the grating 840. The light is redirected through diffraction by the grating 840 back towards the Faraday-rotator 830. The beam 887 is transmitted through the Faraday-rotator 830 within which the polarization of the light is rotated essentially an additional angle α. The beam 888 is partly transmitted straight through the polarization selective beam-splitter 820 and partly deflected in said beam-splitter 820 by its oblique interface 822. The light not deflected 826, which is coupled out of the cavity, has reduced spontaneous emission. The beam deflected in the beam-splitter 820 by its oblique interface 822 is focused by the lens 810 and coupled back into the waveguide 806 of the semiconductor laser die 800. The light is amplified when propagating in the waveguide 806 and is, at least partly, reflected in the facet 802. In this embodiment of the present invention, essentially all of the light coupled out of the optical cavity 826 by the polarization selective beam-splitter 820 has reduced spontaneous emission.

The L-shaped Littrow external cavity configuration explained in the fifth embodiment of the invention, could also be used for a cavity with external feedback elements at both ends. Also, L-shaped cavities could be used in corresponding Littman configurations.

What we claim is:

1. A light outcoupling device for outcoupling of light in an external cavity laser having an external cavity extending between at least one light source and at least one wavelength selective feedback element, the light outcoupling device comprising:

at least one polarization selective beam-splitting optical element, and at feast one Faraday-rotator element optically coupled to said polarization selective beam-splitting optical element, said polarization selective beam-splitting optical element being functionally arranged to fully transmit a linearly polarized light propagating in a first direction, and wherein the wavelength selective feedback element has a polarization function and is optically coupled to the polarization beam-splitting optical element such that the linearly polarized light incident thereon provides the selective feedback with substantially optimum efficiency, and is at least partly outcoupled from the external cavity by the polarization selective beam-splitting optical element when the linearly polarized light is propagating in a second direction.

2. The device according to claim 1, wherein said external cavity laser and light outcoupling device elements are arranged such that linearly polarized light is fully transmitted through the polarization selective beam-splitting optical element, and is incident on the wavelength selective feedback element with a polarization such that said selective feedback element has substantially optimum efficiency.

3. The device according to claim 1, wherein the light source is a semiconductor laser die.

4. The device according to claim 1, wherein the light source comprises a narrow waveguide.

5. The device according to claim 1, further comprising light converging elements.

6. The device according to claim 1, further comprising a first reflecting element.

7. The device according to claim 1, wherein said wavelength selective feedback element redirects the light towards a retro reflector.

8. The device according to claim 1, wherein a light beam path from said at least one light source to said feedback element is L-shaped.

9. Method for outcoupling of light in an external cavity laser having an external cavity extending between at least one light source and at feast one wavelength selective feedback element, said method comprising:

utilizing at least one polarization selective beam-splitting optical element and at least one Faraday-rotator element as outcoupling elements, arranging the external cavity laser and the outcoupling elements such that linearly polarized light is fully transmitted through the polarization selective beam-splitting optical element when propagating in a first direction, and is incident on the wavelength selective feedback element when propagating in a second direction and with a polarization such that said wavelength selective feedback element has substantially optimum efficiency, wherein the linearly Polarized light is at least partly outcoupled from the external cavity by the polarization selective beam-splitting optical element when propagating in a second direction, and wherein the Faraday-rotator element is positioned between the beam-splitting optical element and the wavelength selective feedback element.

10. The method according to claim 9, wherein said light source comprises a Semiconductor laser die.

11. A method for outcoupling of light in an external cavity laser, having an external cavity extending between at least one light source element and at least one wavelength selective feedback element, comprising:

generating light of linear polarization in said light source and emitting said light in a diverging beam, collimating said diverging beam in a light-converging optical element to an linearly polarized light beam, fully transmitting said linearly polarized light beam through a polarization selective beam-splitting optical element in a first direction, rotating the plane of polarization of said light beam in an angle $\alpha + m \cdot 180°$, wherein $0° \leq \alpha \leq 360°$ and m is an integer 0, 1, 2, 3, ..., redirecting said light beam with the rotated plane of polarization, rotating the plane of polarization of said redirected light beam so that the angle of the light polarization becomes an angle $2\alpha$ from a preferred angle $\alpha$ of transmission through said polarization selective beam-splitting optical element, partly transmitting and partly outcoupling said redirected light beam when propagating through said polarization selective beam-splitting optical element in a second direction.

12. The method of claim 11, further comprising selecting an appropriate angle a for determining the fraction of light coupled out of the cavity.

13. The device according to claim 1, wherein the light source comprises a light-emitting element.

14. The device according to claim 1, wherein the light source comprises a light-amplifying element.

15. The device according to claim 9, wherein the light source comprises a light-emitting element.

16. The device according to claim 9, wherein the light source comprises a light-amplifying element.

* * * * *